United States Patent
Cyrille et al.

(10) Patent No.: US 6,954,344 B2
(45) Date of Patent: Oct. 11, 2005

(54) ANTI-PARALLEL TAB SENSOR FABRICATION USING CHEMICAL-MECHANICAL POLISHING PROCESS

(75) Inventors: Marie-Claire Cyrille, San Jose, CA (US); Hardayal Singh Gill, Palo Alto, CA (US); James Mac Freitag, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 107 days.

(21) Appl. No.: 10/439,464

(22) Filed: May 16, 2003

(65) Prior Publication Data

US 2004/0228047 A1 Nov. 18, 2004

(51) Int. Cl.[7] .............................. G11B 5/39; G11B 5/127; H04R 31/00
(52) U.S. Cl. .............................. 360/324.12; 360/324.2; 29/603.16
(58) Field of Search ............................... 216/13, 16, 22, 216/88, 89, 94; 438/692, 712; 257/414; 451/29, 36; 29/603.01, 603.15, 603.16; 360/324.1, 324.2, 324.11, 324.12

(56) References Cited

U.S. PATENT DOCUMENTS

| | | | |
|---|---|---|---|
| 6,208,492 B1 | 3/2001 | Pinarbasi | 360/324.11 |
| 6,219,210 B1 | 4/2001 | Pinarbasi | 360/324.11 |
| 6,295,187 B1 | 9/2001 | Pinarbasi | 360/324.11 |
| 6,327,122 B1 | 12/2001 | Pinarbasi | 360/324.11 |
| 6,353,518 B2 | 3/2002 | Pinarbasi | 360/324.11 |
| 6,353,519 B2 | 3/2002 | Pinarbasi | 360/324.11 |
| 6,398,924 B1 | 6/2002 | Pinarbasi | 204/192.2 |
| 6,714,388 B2 * | 3/2004 | Hasegawa et al. | 360/324.11 |
| 6,831,817 B2 * | 12/2004 | Hasegawa et al. | 360/324.12 |
| 2001/0030842 A1 | 10/2001 | Pinarbasi | 360/324.11 |
| 2001/0040779 A1 | 11/2001 | Pinarbasi | 360/324.11 |
| 2001/0040780 A1 | 11/2001 | Pinarbasi | 360/324.11 |
| 2002/0036873 A1 | 3/2002 | Hara et al. | 360/321 |
| 2002/0085321 A1 | 7/2002 | Carey et al. | 360/324.11 |
| 2003/0042903 A1 * | 3/2003 | Hasegawa et al. | 325/252 |
| 2003/0058587 A1 * | 3/2003 | Hasegawa et al. | 360/324.12 |

FOREIGN PATENT DOCUMENTS

JP  10154618 A  6/1998  ........... H01F/10/08

OTHER PUBLICATIONS

A.M. Toxen, "Capping Layer for Magneto–Resistive Sensor", SA882–0058, OS, P15, 34–715.

* cited by examiner

Primary Examiner—William J Klimowicz
(74) Attorney, Agent, or Firm—Zilka-Kotab, PC

(57) ABSTRACT

A method for fabricating a sensor having anti-parallel tab regions. The method includes forming a free layer, and forming a first layer of a carbon composition above the active area of the free layer. A layer of resist is formed above the first layer of carbon composition. A bias layer is formed above the tab areas of the free layer, the bias layer being operative to substantially pin magnetic moments of the tab areas of the free layer. Leads are formed above the bias layer. A second layer of carbon composition is formed above the tab areas of the free layer. Any material above a plane extending parallel to portions of the second layer of carbon composition above the tab areas are removed using chemical-mechanical polishing. Any remaining carbon composition is removed.

14 Claims, 5 Drawing Sheets

ANTI-PARALLEL TAB SENSOR FABRICATION USING CHEMICAL-MECHANICAL POLISHING PROCESS

FIELD OF THE INVENTION

The present invention relates to magnetic heads, and more particularly, this invention relates to lead overlay read heads having magnetically pinned passive regions and methods for fabricating the same.

BACKGROUND OF THE INVENTION

One well known way to increase the performance of hard disk drives is to increase the areal data storage density of the magnetic hard disk. This can be accomplished by reducing the written data track width, such that more tracks per inch can be written on the disk. To read data from a disk with a reduced track width, it is also necessary to develop sufficiently narrow read head components, such that unwanted magnetic field interference from adjacent data tracks is substantially eliminated.

The standard prior art read head elements include a plurality of thin film layers that are deposited and fabricated to produce a GMR read head, as is known to those skilled in the art. Significantly, where the width of the thin film layers that comprise the GMR read head is reduced below certain values, the magnetic properties of the layers are substantially compromised. To overcome this problem, GMR read heads have been developed in which the thin film layers have an ample width and the electrical leads are overlaid on top of portions of the thin film layers. This lead overlaid configuration has the effect of creating an active read head region having a width that is less than the entire width of the deposited layers, such that the magnetic properties of the thin film layers can be preserved. Thus, in the lead overlaid GMR read heads of the prior art, active magnetic layer portions exist between the electrical leads and passive magnetic layer portions exist beneath the electrical leads.

A problem that has been recognized with regard to such prior art lead overlaid read heads is that the passive region of the magnetic layers of the read head, and particularly the free magnetic layer, is not entirely passive. That is, external magnetic fields, such as from adjacent data tracks, create magnetic field fluctuation and noise within the passive regions of the free magnetic layer beneath the electrical leads. Thus, noise and side reading effects continue to be a problem with lead overlaid GMR read heads.

FIG. 1 is a side cross-sectional view of a prior art electrical lead overlaid read head portion of a magnetic head 100. As depicted therein, the prior art lead overlaid read head generally includes a substrate base 102 that constitutes the material from which the magnetic head is fabricated, such as aluminum titanium carbide. A first magnetic shield 104 is fabricated on the substrate, and an insulation layer 106, typically composed of aluminum oxide, is fabricated upon the magnetic shield 104. A seed layer 108 is deposited upon the insulation layer 106 and a series of thin film layers are sequentially deposited upon the seed layer 108 to form a GMR read head. In this structure, the layers generally include an antiferromagnetic layer 114, a pinned magnetic layer 118 that is deposited upon the anti ferromagnetic layer 114, a spacer layer 122 that is deposited upon the pinned magnetic layer 118, a free magnetic layer 126 that is deposited upon the spacer layer 122 and a cap layer 130 that is deposited upon the free magnetic layer 126. Typically, the antiferromagnetic layer 114 may be composed of PtMn, the pinned magnetic layer 118 may be composed of CoFe, the spacer layer 122 may be composed of Cu, the free magnetic layer 126 may be composed of CoFe and the cap layer 130 may be composed of Ta.

Following the deposition of the GMR read head layers 114–130, a patterned etching process is conducted such that only central regions 140 of the layers 114–130 remain. Thereafter, hard bias elements 148 are deposited on each side of the central regions 140. Following the deposition of the hard bias elements 148, electrical lead elements 154 are fabricated on top of the hard bias elements 148. As depicted in FIG. 1, inner ends 156 of the leads 154 are overlaid on top of outer portions 160 of the layers 114–130 of the central read head layer regions 140. A second insulation layer 164 is fabricated on top of the electrical leads 154 and cap layer 130, followed by the fabrication of a second magnetic shield (not shown) and further components that are well known to those skilled in the art for fabricating a complete magnetic head.

A significant feature of the prior art lead overlaid GMR read head depicted in FIG. 1 is that the portion of the central layer region 140 which substantially defines the track reading width W of the read head 100 is the central portion 144 of the read head layer regions 140 that is disposed between the inner ends 156 of the electrical leads 154. That is, because the electrical current flows through the read head layers between the electrical leads 154, the active portion 144 of the read head layers comprises the width w between the inner ends 156 of the electrical leads 154. The outer portions 160 of the read head layers disposed beneath the overlaid inner ends 156 of the electrical leads 154 are somewhat passive in that electrical current between the electrical leads 154 does not pass through them.

A significant problem with the prior art lead overlaid read head 100 depicted in FIG. 1 is that the magnetization in the outer portions 160 of the free layer 126 beneath the electrical leads 154 is unstable and subject to unwanted magnetic field fluctuations. Additionally, side reading effects from adjacent data tracks as well as magnetic noise is created in the passive portions 160 of the free layer 126 beneath the electrical lead ends 156. Thus, noise and side reading effects continue to be a problem with lead overlaid GMR read heads.

Further, prior art heads have hard bias material on either side of the sensor to exert magnetic force on the free layer to magnetically stabilize the free layer. The problem is that hard bias layers are very thick, and as track sizes shrink, sensors must get smaller. When the track width becomes very narrow, the hard bias layers makes the free layer very insensitive and thus less effective. What was needed was a way to create a sensor with a narrow track width, yet with a free layer that is very sensitive.

To overcome the problems described above, some heads are now constructed such that the magnetization of the free magnetic layer is pinned in the passive regions beneath the overlaid electrical leads, thus stabilizing the passive regions, and reducing noise and side reading effects.

FIG. 2 depicts another prior art lead overlaid read head 200. As depicted therein, the read head 200 includes a GMR read head thin film element 240, as well as the hard bias elements 248. As depicted therein, the prior art lead overlaid read head generally includes a substrate base 202 that constitutes the material from which the magnetic head is fabricated, such as aluminum titanium carbide. A first magnetic shield 204 is fabricated on the substrate, and an insulation layer 206, typically composed of aluminum oxide, is fabricated upon the magnetic shield 204. A seed layer 208 is deposited upon the insulation layer 206 and a series of thin film layers are sequentially deposited upon the seed layer 208 to form a GMR read head. In this structure, the layers generally include an antiferromagnetic layer 214, a pinned magnetic layer 218 that is deposited upon the anti ferromagnetic layer 214, a spacer layer 222 that is deposited upon the pinned magnetic layer 218, a free magnetic layer 226 that is deposited upon the spacer layer 222 and a cap layer 230 that is deposited upon the free magnetic layer 226.

This read head 200 includes an additional magnetic thin film layer 270 that is deposited on top of the hard bias elements 248, such that an inner portion 210 of the layer 270 extends over the outer portions 260 of the layers that comprise the read head element 240. The magnetic layer 270 is deposited on top of the outer portions 260 of the tantalum cap layer 230, and directly on top of the magnetic hard bias elements 248. The electrical leads 254 are thereafter fabricated on top of the magnetic layer 270.

Following the magnetic field initialization of the hard bias elements 248, the magnetic field of the hard bias elements 248 will create corresponding magnetic fields within the magnetic layer 270. Furthermore, because the inner portion 210 of the magnetic layer 270 is deposited on top of the outer portion 260 of the tantalum cap layer 230, which is deposited above the outer portion 260 of the free layer 226, the magnetic field within the inner portion 210 of the magnetic layer 270 will become magnetostatically coupled to the outer portion 260 of the free layer 226 through the tantalum cap layer 230. This provides a pinning effect upon the magnetic fields within the outer portion 260 of the free layer, because it raises the coercivity of the free layer within the outer region 260.

One problem encountered during manufacture of a lead overlaid read head is that when plating this kind of sensor, layer 226 is deposited, then layer 230 is deposited, then layer 270 is deposited as a contiguous layer. Then the portion of magnetic layer 270 in the central portion 244 of the read head layer regions 240 must be etched off without breaking through the cap layer 230. Some prior art processes use the cap layer 230 as a marker indicating when to stop etching. However, this layer 230 is typically only ~8 angstroms or less, so there is danger of etching through the layer 230 and into the free layer 226.

Another drawback is that the prior art read heads 100, 200 of FIGS. 1–2 require hard bias elements 148, 248. As track sizes shrink, sensors must get smaller. The smaller the sensor becomes, the more susceptible it is to interference from the hard bias elements 148, 248. When the track width becomes very narrow, the hard bias elements 148, 248 make the free layer very insensitive and thus less effective.

Another prior art method of creating heads with the magnetic moment of the free layer pinned in the outer regions is to oxidize the section of the magnetic layer in the active area. This makes the material nonmagnetic and thus inactive. FIG. 3 illustrates a lead overlaid read head 300 according to one preferred embodiment. As shown, the read head 300 includes a substrate base 302, a first magnetic shield 304 fabricated on the substrate, and an insulation layer 306 fabricated upon the magnetic shield 304. A seed layer 308 is deposited upon the insulation layer 306 and a series of thin film layers are sequentially deposited upon the seed layer 308 to form a GMR read head. In the preferred embodiment of the present invention, the layers generally include an antiferromagnetic layer 310, a lower pinned layer 312, a first spacer layer 314, a free magnetic layer 318 that is deposited upon the first spacer layer 314, a second spacer layer 322 that is deposited upon the free layer 318, a bias magnetic layer 326 that is deposited upon the second spacer layer 322 and a cap layer 330 that is deposited upon the bias layer 326. The magnetic moments of the free and bias layers are antiparallel.

The section of the magnetic layer is oxidized in the active area 344. The problem encountered here is that the second spacer layer 322 separating the free layer 318 and the bias magnetic layer 326 is typically 8 angstroms or less, so some of the oxidizing material can migrate through the second spacer layer 322, reaching the free layer 318 and oxidizing it. The oxidation in turn affects the signal quality achievable from the free layer 318.

In addition, because the second spacer layer 322 is crystalline, during thermal cycling of the head, and because of the heat generated during use, oxygen can diffuse through the second spacer layer 322 and oxidize the free layer 318, reducing its effectiveness.

What is needed is a way to form a sensor structure having antiparallel tab regions without excessive and dangerous processing on the active region of the sensor.

SUMMARY OF THE INVENTION

The present invention overcomes the drawbacks and limitations described above by providing a method of fabrication for an anti-parallel tab sensor. In this method, the active area of the sensor is protected and untouched during the fabrication. This assures improved performance/sensor stability over the alternative method where bias layer in the active area is oxidized to kill its magnetization.

In one embodiment, a free layer is formed and capped. A first layer of a carbon composition is formed above the active area of the free layer. By "above", what is meant is that a particular portion of a layer is positioned approximately above the referenced portion of the layer below when the structure is positioned in the orientation shown in the drawings attached hereto. A layer of resist is formed above the first layer of carbon composition. The resist and preferably any carbon composition are removed from above the tab areas, preferably using photolithography and etching. The cap above the tab areas is removed, preferably using reactive ion etching and sputtering. Spacer layers are formed above the tab areas of the free layer, the spacer layers being operable to make magnetic moments of ferromagnetic layers on opposite sides thereof antiparallel. Bias layers are formed above the spacer layers, the bias layers being operative to substantially pin magnetic moments of the tab areas of the free layer. Leads are formed above the bias layers. Second layers of carbon composition are formed above the tab areas of the free layer. The layers above a plane extending parallel to portions of the second layer of carbon composition above the tab areas are removed using chemical-mechanical polishing. Finally, any remaining carbon composition is removed, preferably using reactive ion etching.

A sensor manufactured according to the process above includes a free layer having tab areas on opposite sides of an active area, spacer layers formed only on the tab areas of the free layer, the spacer layers being operable to make magnetic moments of ferromagnetic layers on opposite sides thereof antiparallel, bias layers above the spacer layers, the bias layers being operative to substantially pin magnetic moments of the tab areas of the free layer, and leads formed above the bias layers. The sensor may form part of a GMR head, a CPP GMR sensor, or a tunnel valve sensor.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 1:
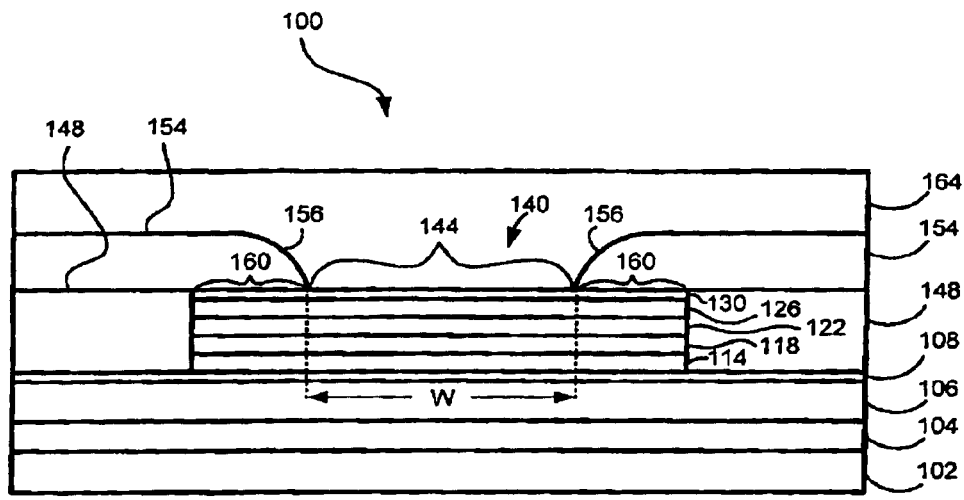
FIG. 1 is a side cross-sectional view of a prior art lead overlaid read head portion of a magnetic head.
Figure 2:
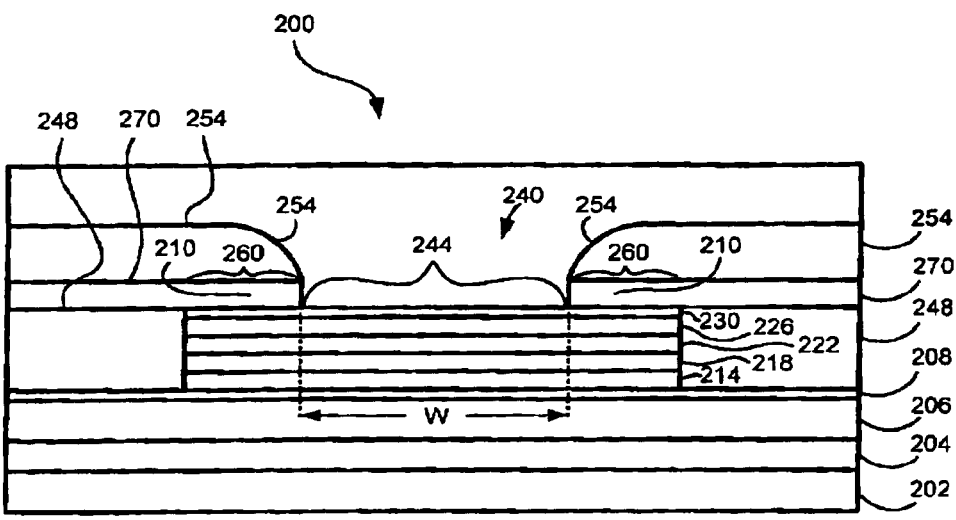
FIG. 2 is a side cross-sectional view of another prior art lead overlaid read head portion of a magnetic head.
Figure 3:
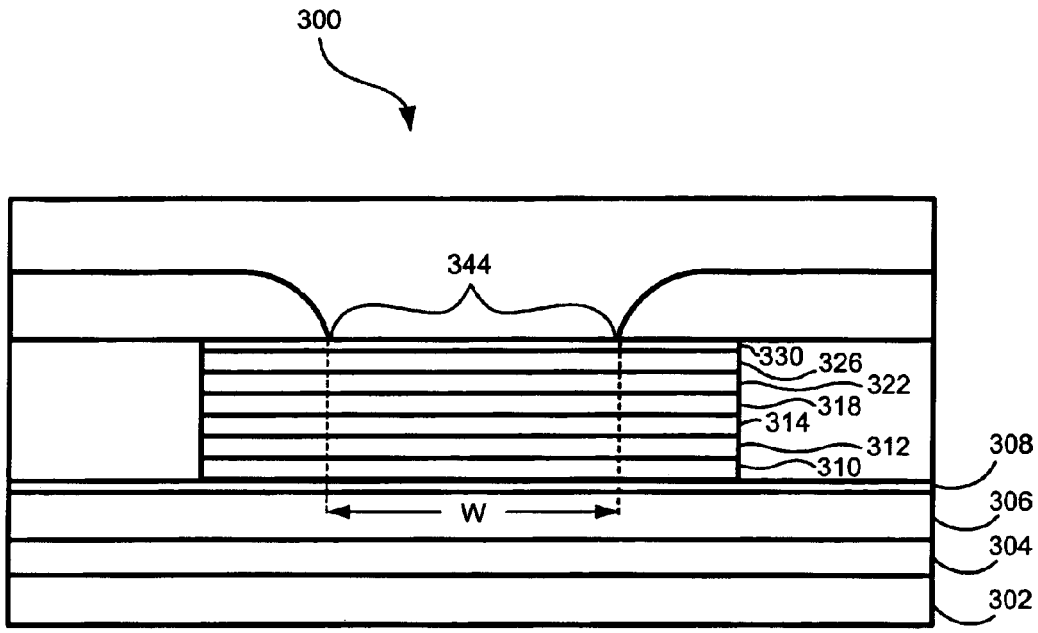
FIG. 3 is a side cross-sectional view of a first preferred embodiment of a lead overlaid read head portion of a magnetic head of the present invention.
Figure 4:
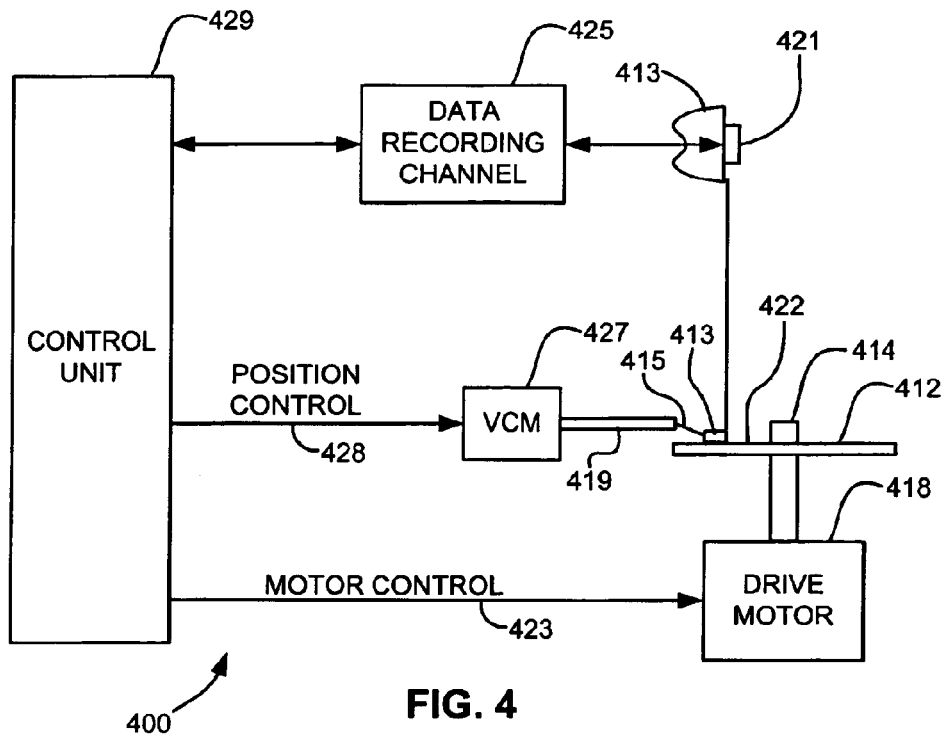
FIG. 4 is a perspective drawing of a magnetic disk drive system in accordance with one embodiment.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording media on each disk is in the form of an annular pattern of concentric data tracks (not shown) on disk 412.

At least one slider 413 is positioned adjacent to the disk 412, each slider 413 supporting one or more magnetic read/write heads 421. More information regarding such heads 421 will be set forth hereinafter during reference to FIGS. 5–7. As the disks rotate, slider 413 is moved radially in and out over disk surface 422 so that heads 421 may access different tracks of the disk where desired data are recorded. Each slider 413 is attached to an actuator arm 419 by way of a suspension 415. The suspension 415 provides a slight spring force which biases slider 413 against the disk surface 422. Each actuator arm 419 is attached to an actuator means 427. The actuator means 427 as shown in FIG. 4 may be a voice coil motor (VCM). The VCM comprises a coil movable within a fixed magnetic field, the direction and speed of the coil movements being controlled by the motor current signals supplied by controller 429.

During operation of the disk storage system, the rotation of disk 412 generates an air bearing between slider 413 and disk surface 422 which exerts an upward force or lift on the slider. The air bearing thus counter-balances the slight spring force of suspension 415 and supports slider 413 off and slightly above the disk surface by a small, substantially constant spacing during normal operation.

The various components of the disk storage system are controlled in operation by control signals generated by control unit 429, such as access control signals and internal clock signals. Typically, control unit 429 comprises logic control circuits, storage means and a microprocessor. The control unit 429 generates control signals to control various system operations such as drive motor control signals on line 423 and head position and seek control signals on line 428. The control signals on line 428 provide the desired current profiles to optimally move and position slider 413 to the desired data track on disk 412. Read and write signals are communicated to and from read/write heads 421 by way of recording channel 425.

The above description of a typical magnetic disk storage system, and the accompanying illustration of FIG. 4 are for representation purposes only. It should be apparent that disk storage systems may contain a large number of disks and actuators, and each actuator may support a number of sliders.

FIGS. 5A–D graphically illustrate the fabrication of a sensor having anti-parallel tab regions using a Chemical Mechanical Polishing (CMP) lift-off process. In this method, the active area of the sensor is protected and untouched during the fabrication. This assures improved performance/sensor stability over the alternative methods described above where the bias layer in the active area is oxidized to kill its magnetization or physically removed.

Figure 5A:
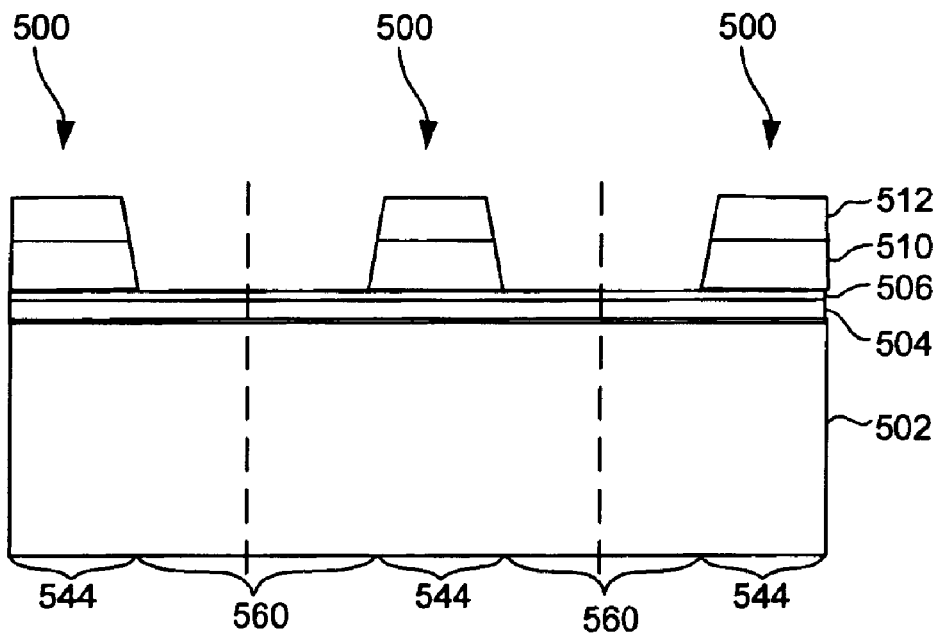
FIGS. 5A–D graphically illustrate the fabrication of a sensor having anti-parallel tab regions using a Chemical Mechanical Polishing (CMP) lift-off process.

FIG. 5A illustrates a partially formed wafer upon which read head sensors 500 are formed. As shown, the starting substrate is a free layer 504 formed on a suitable substrate 502 and capped with Ta and/or Ru cap 506. Ta works well to protect the sensor, and is compatible with most processes. Note also that the substrate 502 can be formed using any suitable process and in any suitable structure, including those discussed above with reference to FIGS. 1–4.

In an illustrative embodiment, the substrate can include a substrate base that constitutes the material from which the slider is fabricated, such as aluminum titanium carbide. A first magnetic shield is fabricated on the substrate, and an insulation layer, typically composed of aluminum oxide, is fabricated upon the magnetic shield. A seed layer is deposited upon the insulation layer and a series of thin film layers are sequentially deposited upon the seed layer to form a GMR read head. In this structure, the layers generally include an antiferromagnetic layer, a pinned magnetic layer that is deposited upon the anti ferromagnetic layer, a spacer layer that is deposited upon the pinned magnetic layer, and the free magnetic layer 504 deposited upon the spacer layer. The antiferromagnetic layer may be composed of PtMn; the pinned magnetic layer may be composed of CoFe, NiFe, or some combination therof; the spacer layer may be composed of Cu; the free magnetic layer may be composed of CoFe, NiFe, or some combination therof; and the cap layer may be composed of Ta. Note that other materials may also be used.

The process steps are outlined for bottom GMR here i.e., pinned layer at bottom. Layers of Diamond Like Carbon (DLC) 510 and resist 512 are added to the structure. The DLC/Resist layers 510, 512 are coated and patterned (i.e., by photolithography and deposition) as in a standard CMP process. Then, using photolithography and etching, material is selectively removed from the area herein referred to as tab areas. The active sensor area stays covered with DLC. The area still covered by DLC/resist forms the active area 544 of the sensor. Tab areas 560 are defined on opposite sides of the active areas 544.

Figure 5B:
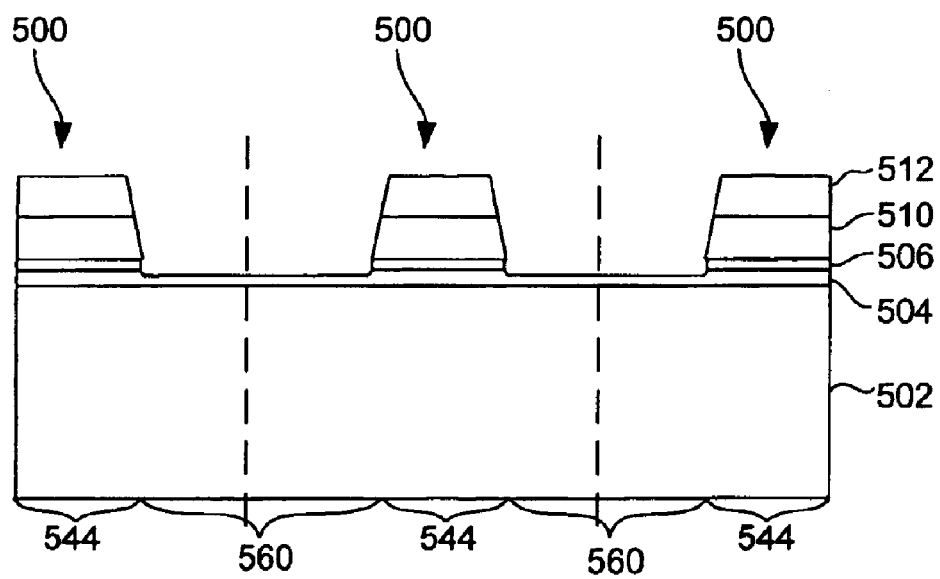

FIG. 5B illustrates processing of the tab areas 560 of the structure shown in FIG. 5A. As shown, the Ta/Ru cap 506 is removed from the tab area, preferably using Reactive Ion Etching (RIE). RIE only removes the cap and does not affect the sensor. Then the tab area is ion milled (sputter cleaned) to remove residual Ta/Ru from the sensor. The DLC 510 protects the active areas 544 from damage during these processes. Note that a portion of the sensor in the tab area has also been removed during the milling. This is acceptable, because the milled portion of the sensor (in the tab areas)

will be inactive once the bias layer is formed thereon. Thus, it is permissible to mill into the free layer 504 and refill with fresh soft magnetic material if necessary. In this example, up to about 15 Angstroms of material can be removed from the tab area of the free layer 504 without adverse consequences.

Figure 5C:
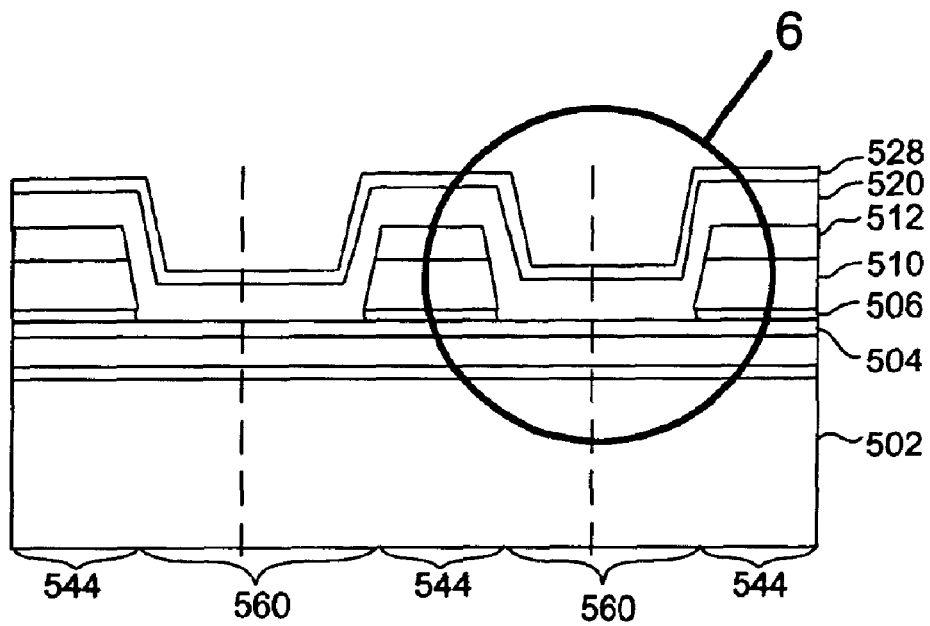

FIG. 5C illustrates addition of spacer, bias, cap, and lead layers to the structure shown in FIG. 5B. As shown in FIG. 5C, the tab areas 560 of the free layer 504 are refilled with the same material as the existing free layer 504 to bring the thickness of the free layer 504 in the tab areas 560 to about the same thickness as in the active areas 544. This additional refilled material 504 will also become part of stack 520.

With continued reference to FIG. 5C, the spacer, bias, cap, and lead layers are shown collectively as layer 520. The spacer layer is formed over the free layer 504. Ru in a layer of about 5–10 Å is the preferred material for the spacer layer, though Cr can also be used, preferably in a thickness about less than about 10 Å, ideally about 8–10 Å. The spacer layer is operable to make magnetic moments of ferromagnetic layers on opposite sides thereof antiparallel. A bias layer is then deposited. The bias layer is operative to substantially pin magnetic moments of the tab areas of the free layer. The bias layer is preferably composed of FeN, and ideally mostly Fe with a small amount of N, e.g., 2–5%. Materials such as NiFe can also be used. A cap layer is formed on the bias layer. The cap layer can be of Ta. Then leads are deposited above the bias layers. Illustrative materials for the leads include Au and Rh.

Magnetically, the free and bias layers may require a certain thickness to be effective. In one example where NiFe is used for the bias layer, the bias layer is about 25% thicker (as measured vertically in the structure shown in the drawings) than the free layer 504. For example, if the free layer 504 is about 30 Å, the bias layer is about 37 to 40 Å. FeN has about twice the magnetic moment of NiFe. Because FeN has twice the moment, an FeN bias layer need only be half as thick as a layer of NiFe. Thus, in the foregoing example, the FeN bias layer would only need to be about 15–20 Å thick. A preferred thickness of the bias layer is 50–80% less than the thickness of the free layer 504. A DLC overcoat 528 is added to the structure of FIG. 5C.

Figure 6:
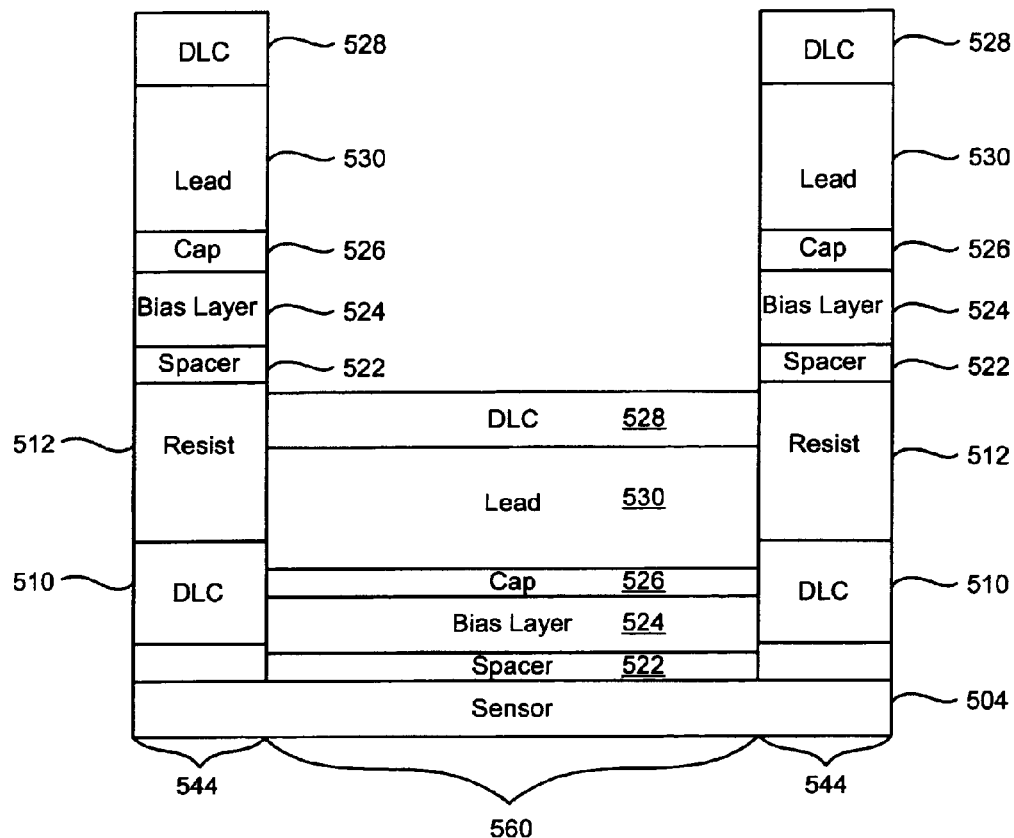
FIG. 6 is a detailed illustration of the structure of FIG. 5C taken from Circle 6 of FIG. 5C.

FIG. 6 is a detailed illustration of the structure of FIG. 5C taken from Circle 6 of FIG. 5C. As shown, the spacer layer is denoted by reference numeral 522, the bias layer is denoted by reference numeral 524, the cap layer is denoted by reference numeral 526, and the lead layer is denoted by reference numeral 530.

Figure 5D:
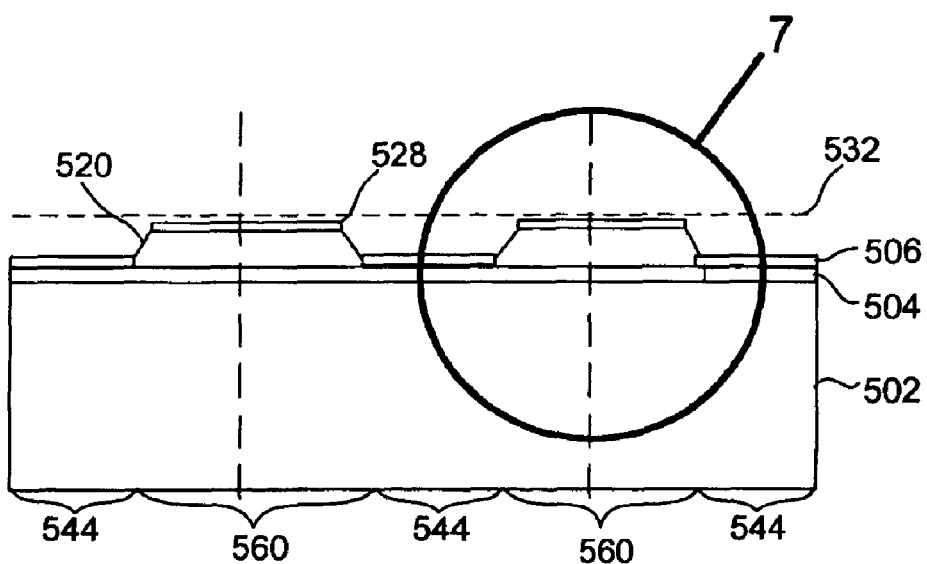

FIG. 5D shows the removal of the several layers from the structure of FIG. 5C. A CMP lift-off process is used to remove any materials above a plane 532 extending parallel to portions of the second layer of DLC 528 in the tab regions. The DLC is not affected by the CMP, and is deliberately left in place to protect the layers under it. Then RIE is used to remove the remaining DLC 510, 528. RIE will not damage the underlying layers.

After the above processes have been completed, each sensor active area 544 has the following structure: free layer/Ta/Ru. The tab areas 560 each have the following structure: free layer/Ru/bias layer (e.g. CoFe/NiFe)/cap/lead. The magnetic moments of the tab areas of the free layer are pinned antiparallel to moments of the bias layers. The bias layer will typically have a thickness profile that is thicker near the middle of the tab area than at the edges (near the active area of the sensor). It is more important to have proper thicknesses at the edge of the track because that is where it is critical to pin the underlying portion of the free layer. Also, the spacer layer is not continuous across the sensor, as the spacer layer remains only in the tab area. Note too that the bias layers may show signs of oxidation.

Figure 7:
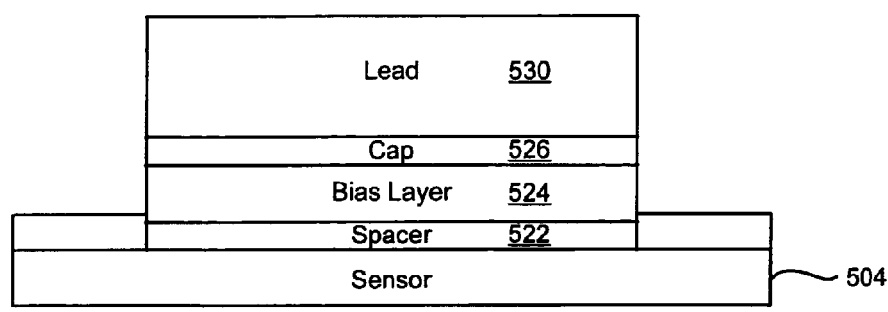
FIG. 7 is a detailed illustration of the structure of FIG. 5D taken from Circle 7 of FIG. 5D.

FIG. 7 is a detailed illustration of the structure of FIG. 5D taken from Circle 7 of FIG. 5D.

One major advantage of this method is that the active area free layer material is untouched by subsequent manufacturing processes. Since the tab area of the free layer is pinned, small increase in Hc/Hk by the processes will not degrade performance. The active area of the head where the sensor is sensing flux from the disk is very sensitive to flux, i.e., is very soft. So it is desirable that Hc/Hk be very small. During prior art processing, the oxidation of the bias layer in the active region could contaminate the free layer, leading to an increase in Hc/Hk, which would degrade performance. The processes described herein do not touch the active area, but rather affect the tab areas. Because the free layer is pinned in the tab areas, some degradation of the free layer in the tab areas will not affect performance.

This method of fabrication is also applicable to other structures, including CPP GMR and Tunnel Valve sensors. This process also allows use of oxidation to raise the resistivity of the AP-Tab region for TV and CPP GMR application to avoid current spreading problem. The bias layer can be oxidized to raise its resistance before the cap and lead deposition.

While various embodiments have been described above, it should be understood that they have been presented by way of example only, and not limitation. For example, the structures and methodologies presented herein are generic in their application to all MR heads, AMR heads, GMR heads, spin valve heads, etc. Thus, the breadth and scope of a preferred embodiment should not be limited by any of the above-described exemplary embodiments, but should be defined only in accordance with the following claims and their equivalents.

What is claimed is:

1. A method for fabricating a sensor having anti-parallel tab regions, comprising:

forming a free layer having tab areas on opposite sides of an active area;

forming a first layer of a carbon composition above the active area of the free layer;

forming a layer of resist above the first layer of carbon composition;

forming a bias layer above the tab areas of the free layer, the bias layer being operative to substantially pin magnetic moments of the tab areas of the free layer;

forming leads above the bias layer;

forming a second layer of carbon composition above the tab areas of the free layer;

removing any layers above a plane extending parallel to portions of the second layer of carbon composition above the tab areas using chemical-mechanical polishing; and removing any remaining carbon composition.

2. A method as recited in claim 1, wherein the first layer of carbon composition is formed by patterning and coating.

3. A method as recited in claim 1, further comprising forming a cap layer on the free layer prior to forming the first layer of carbon composition, and removing the cap layer from the tab areas of the free layer prior to forming the bias layers.

4. A method as recited in claim 3, wherein a portion of the free layer is also removed during removal of the cap layer.

5. A method as recited in claim 1, further comprising forming spacer layers above the tab areas of the free layer prior to forming the bias layers, the spacer layers being operable to make magnetic moments of the tab areas of the free layer and of the bias layers antiparallel.

6. A method as recited in claim 5, wherein the spacer layers comprise at least one of Ru and Cr.

7. A method as recited in claim 1, further comprising forming a cap on each of the bias layers.

8. A method as recited in claim 1, wherein the magnetic moments of the tab areas of the free layer are antiparallel to moments of portions of the pinned layer above the tab areas of the free layer.

9. A method as recited in claim 1, wherein the sensor forms part of a GMR head.

10. A method as recited in claim 1, wherein the sensor is a CPP GMR sensor.

11. A method as recited in claim 1, wherein the sensor is a tunnel valve sensor.

12. A method for fabricating a sensor having anti-parallel tab regions, comprising:

forming a free layer having tab areas on opposite sides of an active area;

forming a cap layer on the free layer;

forming a first layer of a carbon composition above the active area of the free layer;

forming a layer of resist above the first layer of carbon composition;

removing the resist from above the tab areas;

removing the cap from above the tab areas;

forming spacer layers above the tab areas of the free layer, the spacer layers being operable to make magnetic moments of ferromagnetic layers on opposite sides thereof antiparallel;

forming bias layers above the spacer layers, the bias layers being operative to substantially pin magnetic moments of the tab areas of the free layer;

forming leads above the bias layers;

forming second layers of carbon composition above the tab areas of the free layer;

removing any layers above a plane extending parallel to portions of the second layer of carbon composition above the tab areas using chemical-mechanical polishing; and removing any remaining carbon composition.

13. A method as recited in claim 12, wherein the spacer layers comprise at least one of Ru and Cr.

14. A method as recited in claim 12, wherein the magnetic moments of the tab areas of the free layer are pinned antiparallel to moments of portions of the bias layer above the tab areas of the free layer.

* * * * *